(12) United States Patent
Masuda et al.

(10) Patent No.: US 6,586,991 B2
(45) Date of Patent: Jul. 1, 2003

(54) DIGITAL POWER AMPLIFIER

(75) Inventors: Toshihiko Masuda, Tokyo (JP); Kazunobu Ohkuri, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/992,605

(22) Filed: Nov. 14, 2001

(65) Prior Publication Data

US 2002/0105377 A1 Aug. 8, 2002

(30) Foreign Application Priority Data

Nov. 17, 2000 (JP) ........................................ 2000-351410

(51) Int. Cl.[7] ................................................ H03F 3/38
(52) U.S. Cl. ...................................... 330/10; 330/207 A
(58) Field of Search ............................... 330/10, 207 A, 330/251

(56) References Cited

U.S. PATENT DOCUMENTS 5,929,702 A * 7/1999 Myers et al. ................ 330/136
6,016,075 A * 1/2000 Hamo .......................... 330/10
6,211,728 B1 * 4/2001 Chen et al. ................... 330/10
6,348,836 B2 * 2/2002 Delano ......................... 330/10

* cited by examiner

Primary Examiner—Henry Choe
(74) Attorney, Agent, or Firm—Jay H. Maioli

(57) ABSTRACT

A digital power amplifier including a switching control device for generating a first switching control signal and a second switching control signal which results from inverting the first switching control signal at an equal timing based upon an inputted audio signal, wherein the first and second switching control signals generated from the switching control device are respectively supplied to control terminals of first and second switching devices so that the first and second switching devices are driven in a push-pull manner to produce an audio signal amplified when the power source is switched. Output characteristics are prevented from being deteriorated by noise from the power source by canceling out radiation of the signals generated from the two switching devices and deterioration of outputted audio characteristics due to noise from the power source is prevented.

6 Claims, 4 Drawing Sheets

FIG. 1 (RELATED ART)
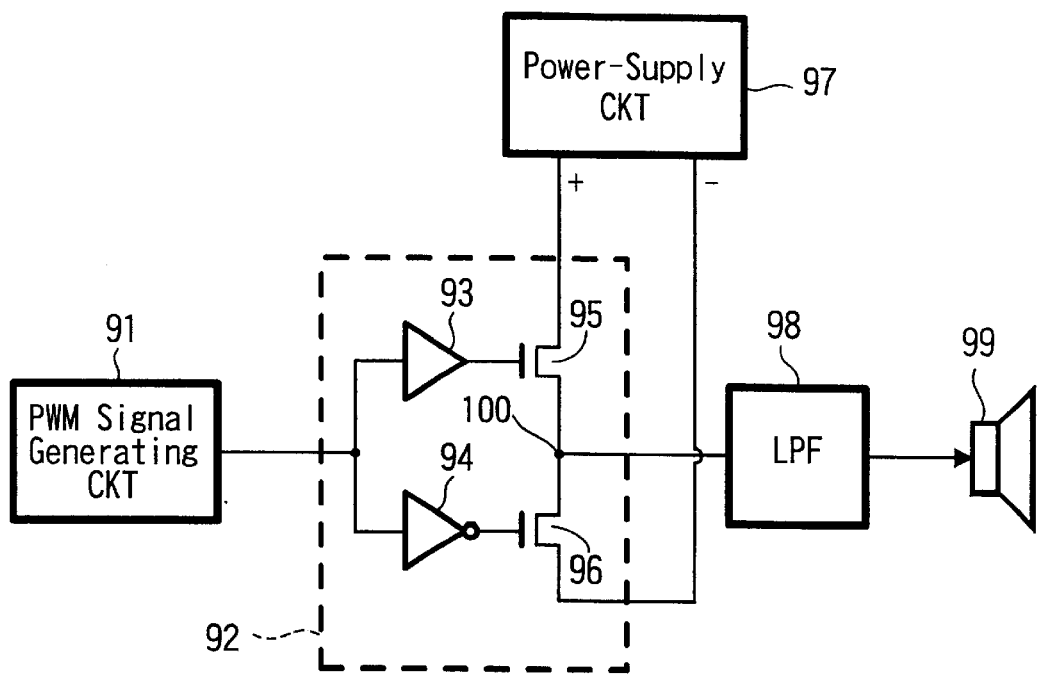
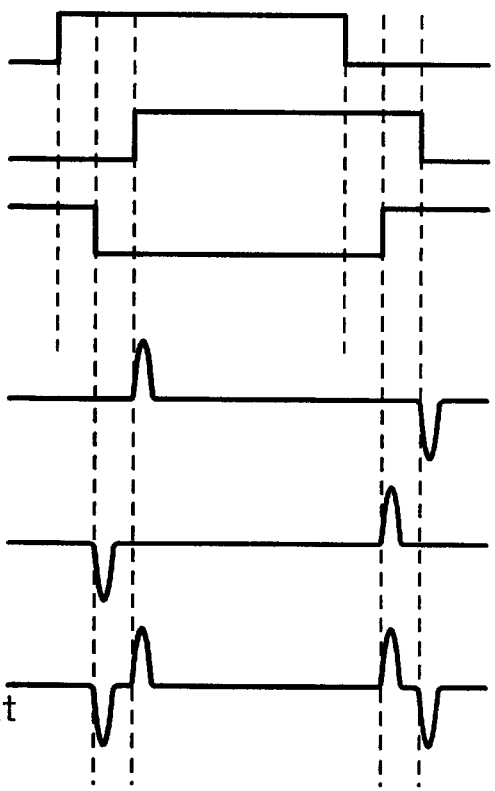
FIG. 3A (RELATED ART) PWM Signal
FIG. 3B (RELATED ART) First Switching Signal
FIG. 3C (RELATED ART) Second Switching Signal
FIG. 3D (RELATED ART) First Differential Component
FIG. 3E (RELATED ART) Second Differential Component
FIG. 3F (RELATED ART) Superimposed Differential Component

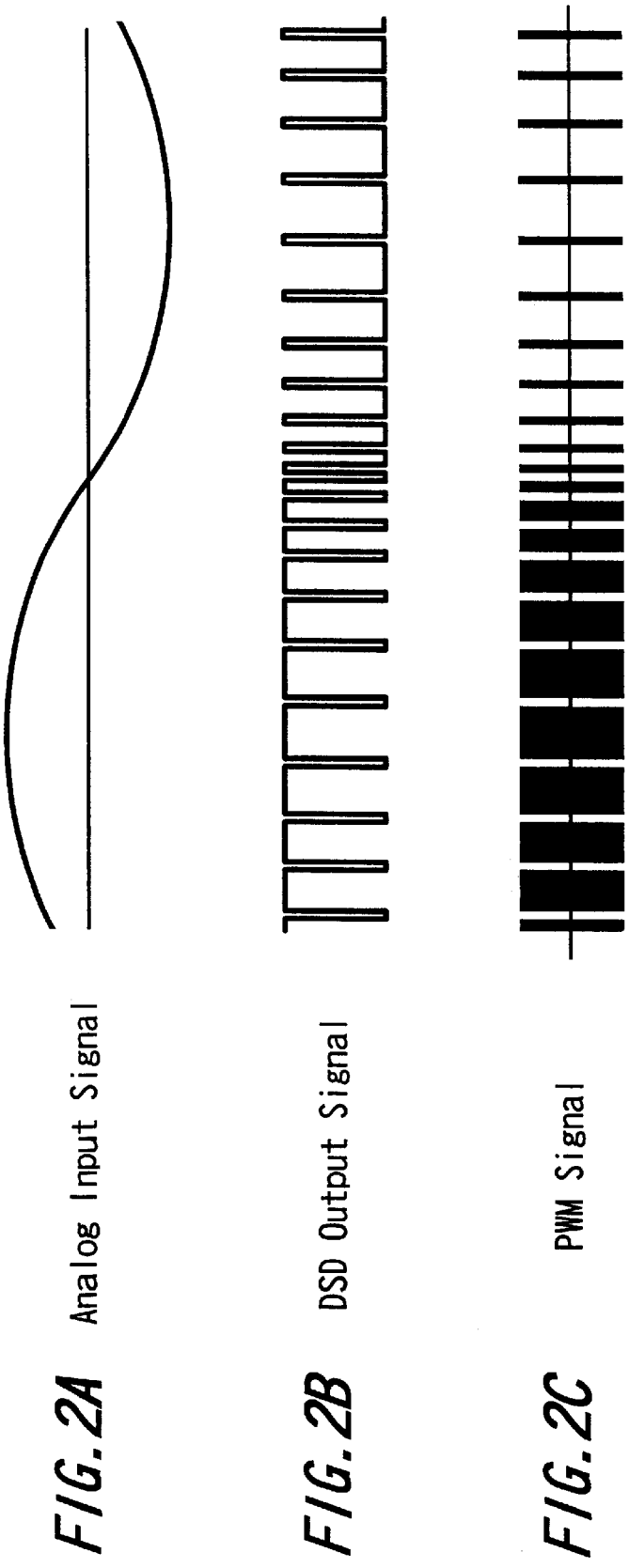

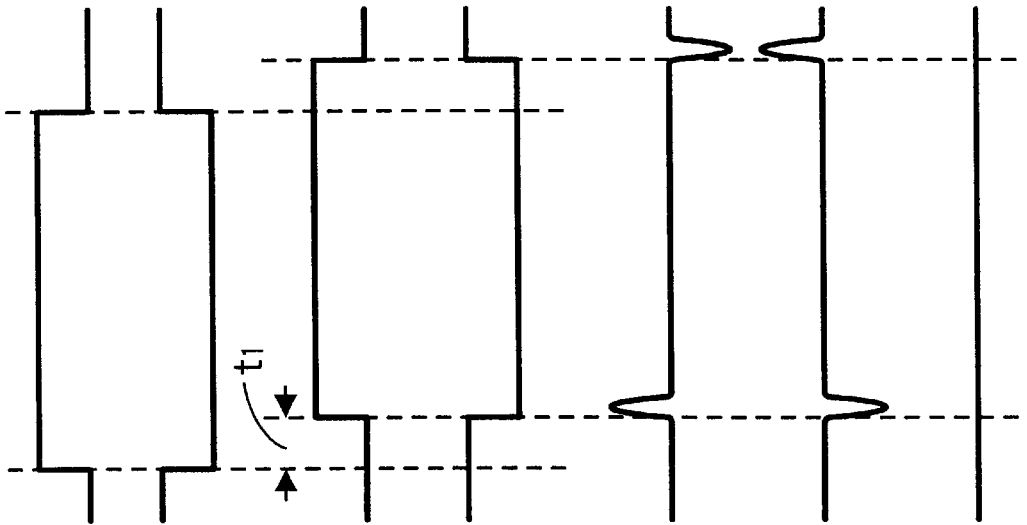
FIG. 5A  First PWM Signal
FIG. 5B  Second PWM Signal
FIG. 5C  First Switching Signal
FIG. 5D  Second Switching Signal
FIG. 5E  First Differential Component
FIG. 5F  Second Differential Component
FIG. 5G  Superimposed Differential Component

DIGITAL POWER AMPLIFIER

BACKGROUND OF THE INVENTION

1. Field of the Invention

The present invention relates generally to an audio power amplifier for amplifying an audio signal to drive a speaker, and particularly to a digital power amplifier capable of amplifying an audio signal by driving a switching means with a signal modulated by a suitable modulation system such as a PWM (pulse width modulation) system.

2. Description of the Related Art

Heretofore, various power amplifiers for amplifying an audio signal to drive a speaker have become commercially available on the market. As one system of these power amplifiers, there have been developed a power amplifier called a digital power amplifier capable of amplifying an audio signal by directly switching a stabilized power-supply with a pulse signal modulated by an inputted digital audio signal. This digital power amplifier generates pulse-width-modulated (PWM) PWM wave (hereinafter this PWM wave will be referred to as a "PWM signal") based upon the inputted digital audio signal, for example, and switches a stabilized DC (direct current) power-supply at a high speed by using this PWM signal to thereby obtain a speaker drive signal by extracting an audio signal component from the power-supply thus switched.

FIG. 1 of the accompanying drawings is a schematic block diagram showing an example of an arrangement of a digital power amplifier according to the related art. FIG. 1 shows a circuit arrangement of a related-art digital power amplifier capable of switching a power switch by using a PWM signal. As shown in FIG. 1, this digital power amplifier generates a PWM signal, which is a pulse-width-modulated pulse signal, based upon an audio signal supplied to a PWM signal generating circuit 91. A PWM signal outputted from the PWM signal generating circuit 91 is supplied to a switching module 92 which serves as a means for switching a power-supply.

As shown in FIG. 1, within the switching module 92, the supplied PWM signal is supplied through a buffer amplifier 93 to the gate of a first switching element 95. Further, the supplied PWM signal is supplied through an inverter gate 94 to the gate of a second switching element 96. The first and second switching elements 95 and 96 are each formed of a MOS (metal oxide semiconductor) field-effect transistor in which the source-drain path is conducted under control of the PWM signal developed at the gate thereof.

The first and second switching elements 95 and 96 are formed as means for switching a DC power-supply output from the power-supply circuit 97. Specifically, there is prepared the power-supply circuit 97 which generates a stabilized DC voltage by rectifying and smoothing a commercially-available power source. An output end of a positive (+) power source obtained from this power-supply circuit 97 is connected to the source of the first switching element 95, and an output end of a negative (−) power source obtained from this power-supply circuit 97 is connected to the drain of the second switching element 96. Then, the drain of the first switching element 95 and the source of the second switching element 96 are connected together to provide a junction 100. A signal developed at this junction 100 is supplied to a low-pass filter (LPF) 98 as an output from the switching module 92.

The low-pass filter 98 removes high-frequency components from the signals obtained at the switching of the first and second switching elements 95 and 96 to extract an audio signal component. The audio signal thus extracted is supplied to a speaker apparatus 99 as an output audio signal of an audio amplifier and thereby outputted from the speaker apparatus 99 to the outside.

The first and second switching elements 95 and 96 respectively function as switches which are driven in a push-pull circuit fashion. Specifically, the first and second switching elements 95 and 96 are each switching means in which the source-drain path conducts when a pulse waveform of a PWM signal supplied to the gate is held at high level and in which the source-drain path does not conduct when the above pulse waveform of the PWM signal is held at low level. The pulse waveform of the PWM signal supplied to the gate of the first switching element 95 and the pulse waveform of the PWM signal supplied to the second switching element 96 are in 180° phase relationship with each other.

Therefore, when the pulse waveform supplied to the gate of the first switching element 95, for example, is held at high level, the pulse waveform supplied to the gate of the second switching element 96 goes to low level. As a consequence, any one of the positive power source and the negative power source is connected to and supplied to the side of the low-pass filter 98 connected to the junction 100 between the first and second switching elements 95 and 96 in response to the switching state obtained at that time. The switching is controlled as described above, whereby an audio signal waveform amplified by the voltage is outputted as the output of the low-pass filter 98. At that very moment, the central level of the audio signal waveform is set to 0 V.

The processing for generating a PWM signal, which is a pulse-width-modulated signal, from the audio signal is executed based upon a principle shown in FIGS. 2A to 2C, for example. When there is an analog audio signal having a sine wave shown in FIG. 2A, this analog audio signal is converted into digital data of one bit system. According to this embodiment, the analog audio signal is converted into digital data of one bit system, shown in FIG. 2B, in which the levels of the signal waveforms are expressed in the form of a pulse waveform density in a so-called DSD (direct stream digital) fashion. Then, based upon the digital data of one bit system, there is executed a processing for generating a PWM signal which is pulse-width-modulated as shown in FIG. 2C. Then, the switching means which switches the power-supply is turned on and off under control of the PWM signal thus generated with the result that there can be generated a waveform equal to the waveform of the analog audio signal amplified by the power-supply voltage.

When the power amplifier has the arrangement in which the two switching elements 95 and 96 are driven in a push-pull fashion as shown in FIG. 1, the inverted signal of the PWM signal which drives one switching element is generated by using the inverter gate 94 within the switching module 92. However, when the inverted signal is generated by using the inverter gate as described above, a very small difference occurs between a timing of the control signal supplied to the gate of one switching element and a timing of the control signal supplied to the gate of the other switching element. As a consequence, there arises a problem that noise will be generated from the power-supply due to the above difference between the timings.

FIGS. 3A through 3F are diagrams of waveforms of respective signals and respective differential components obtained when the two switching elements 95 and 96 are driven in a push-pull fashion in the circuit arrangement shown in FIG. 1. For example, when the PWM signal supplied from the PWM signal generating circuit 91 to the switching module 92 has a waveform shown in FIG. 3A, this pulse waveform is supplied to and amplified by the buffer amplifier 93 so that this waveform is slightly delayed from the waveform of the inputted PWM signal as shown in FIG. 3B. Further, the waveform of the inverted pulse which results from inverting the PWM signal inputted to the switching module 92 by the inverter gate 94 becomes a waveform which is slightly delayed from the inputted PWM waveform in timing as shown in FIG. 3C.

Since the buffer amplifier 93 and the inverter gate 94 are the circuits whose characteristics are different from a principle standpoint, a time difference occurs in the timings between the leading edge and the trailing edge of the control signal waveform (see FIG. 3B) of the first switching element 95 and the control signal waveform (see FIG. 3C) of the second switching element 96.

Accordingly, a time differential (first differential component) of currents consumed by the first switching element 95 occurs in the leading edge and the trailing edge of the pulse waveform of the signal supplied to the gate of the first switching element 95 as shown in FIG. 3D. Further, a time differential (second differential component) of currents consumed by the second switching element 96 occurs in the leading edge and the trailing edge of the pulse waveform of the signal supplied to the gate of the second switching element 96 as shown in FIG. 3E. As a consequence, the differential components are generated in the two switching elements 95 and 96 at different timings. Accordingly, the waveform of the signal radiated from the switching module 92 becomes a waveform upon which the respective differential components are superimposed as shown in FIG. 3F. Then, a signal corresponding to this differential waveform shown in FIG. 3F is generated from the transmission line of the PWM signal as the radiation, which as a result causes noise of the power-source to occur in each switching element. Consequently, it is unavoidable that audio characteristics of the audio signal outputted from the speaker apparatus 99 connected to the digital power amplifier are deteriorated, influenced by the noise.

SUMMARY OF THE INVENTION

In view of the aforesaid aspect, it is an object of the present invention to provide a digital power amplifier in which outputted audio characteristics can be prevented from being deteriorated due to influences exerted by noise from a power-supply.

According to an aspect of the present invention, there is provided a digital power amplifier which is comprised of a switching control means for generating first and second switching control signals which are inverted in phase with each other at an equal timing based upon an inputted audio signal, a first switching means which conducts/does not conduct under control of the first switching control signal and a second switching means which conducts/does not conduct under control of the second switching control signal, wherein an output signal is obtained from a junction between the first and second switching means.

In accordance with another aspect of the present invention, there is provided a digital power amplifier which is comprised of a switching control means for generating first and second switching control signals which are inverted in phase with each other at an equal timing based upon an input audio signal, a first switching means which conducts/ does not conduct under control of the first switching control signal, a second switching means which conducts/does not conduct under control of the second switching control signal, a third switching means which conducts/does not conduct under control of the first switching control signal and a fourth switching means which conducts/does not conduct under control of the second switching control signal, wherein output signals are generated from a junction between the first and second switching means and a junction between the third and fourth switching means.

According to the present invention, since a timing at which one of the two switching means which are driven in a push-pull fashion conducts and a timing at which the other of the two switching means does not conduct become equal to each other and the time differentials of the currents consumed by the respective switching means are generated with opposite phases at an equal timing, the differential components are canceled each other out as a total current of the two switching means

BRIEF DESCRIPTION OF THE DRAWINGS

FIG. 1 is a schematic block diagram showing an example of a switching control arrangement of a digital power amplifier according to the related art;

FIGS. 2A to 2C are respectively diagrams of waveforms of an analog inputted signal, a DSD (direct stream digital) output signal and a PWM (pulse-width-modulated) signal and to which reference will be made in explaining a principle by which a PWM signal is generated;

FIGS. 3A to 3F are respectively diagrams of waveforms of a PWM signal, a first switching signal, a second switching signal, a first differential component, a second differential component and a superimposed differential component and to which reference will be made in explaining a digital power amplifier according to the related art;

FIGS. 5A to 5G are respectively diagrams of waveforms of a first PWM signal, a second PWM signal, a first switching signal, a second switching signal, a first differential component, a second differential component and a superimposed differential component and to which reference will be made in explaining a digital power amplifier according to the present invention.

DESCRIPTION OF THE PREFERRED EMBODIMENT

Figure 4:
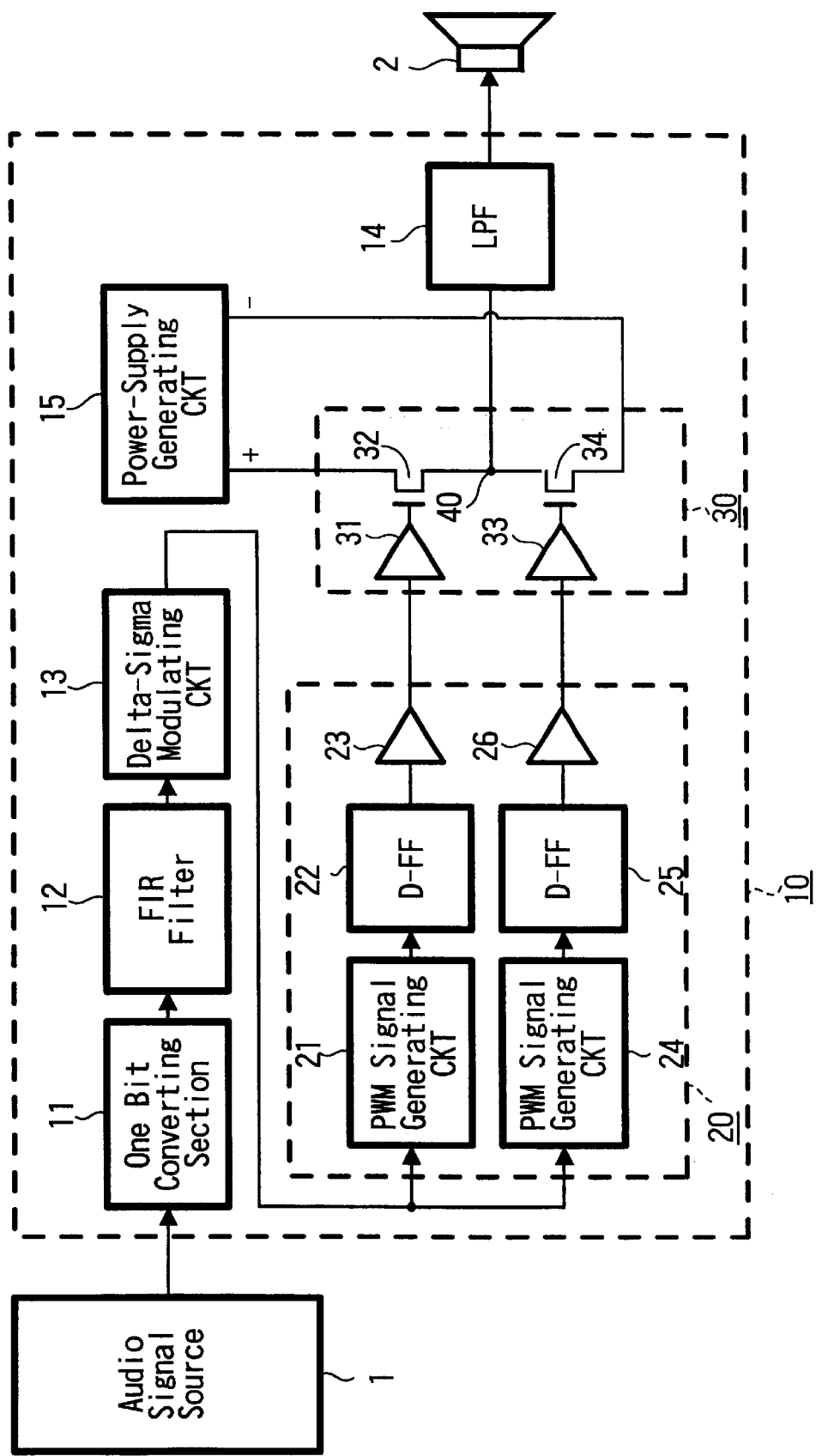
FIG. 4 is a block diagram showing an example of an overall arrangement of a digital power amplifier according to an embodiment of the present invention.

A digital power amplifier according to an embodiment of the present invention will be described below with reference to FIG. 4 and FIGS. 5A through 5G.

FIG. 4 is a block diagram showing an overall arrangement of a digital power amplifier according to an embodiment of the present invention.

A digital power amplifier, generally depicted by reference numeral 10 in FIG. 4, is supplied with a digital audio signal from an audio signal source 1 in the outside. The digital power amplifier 10 supplies the digital audio signal to a one bit converting section 11. The digital audio signal supplied from the audio signal source 1 is multi-bit digital audio data (i.e., data which may express one sample, for example, by 16 bits) reproduced from a compact disc (CD), for example. The one bit converting section 11 converts the supplied multi-bit digital audio data to provide one-bit digital data. Specifically, the one bit converting section 11 converts the supplied multi-bit digital audio data to provide DSD digital data which is expressed by a density of one bit pulse as already shown in FIG. 2B. At that time, in the case of this embodiment, the supplied multi-bit digital audio data is converted into digital audio data of one bit data sampled to 64 times (i.e., 64 fs/1 bit), for example.

An output from the one bit converting section 11 is supplied to an FIR (finite impulse response) filter 12 which is a digital filter and is thereby converted into data which is down-sampled to ¼, for example. Specifically, digital audio data of 64 fs/1 bit is converted into digital audio data of 16 fs/24 bits, for example. Then, the digital audio data of 16 fs/24 bits outputted from the FIR filter 12 is supplied to a delta-sigma (delta-Σ) modulating circuit 13, in which it is compressed to provide data of 16 fs/6 bits. The data of 16 fs/6 bits, compressed at the delta-sigma modulating circuit 13, is supplied to a PWM (pulse width modulation) processing section 20.

The PWM processing section 20 according to this embodiment includes two circuits of a first PWM signal generating circuit 21 and a second PWM signal generating circuit 24. The first and second PWM signal generating circuits 21 and 24 generate pulse-width-modulated signals, respectively. Pulse waveforms of the PWM signals generated from the first and second PWM signal generating circuits 21 and 24 are in 180° phase relationship with each other, and the output timings of the two PWM signals are made equal to each other.

The PWM signal outputted from the first PWM signal generating circuit 21 is supplied to a D-type flip-flop circuit (D-FF) 22, in which it is converted into a pulse of a timing synchronized with a clock supplied to the PWM processing section 20. A PWM signal outputted from the D-type flip-flop 22 circuit (this PWM signal will hereinafter be referred to as a "first PWM signal") is outputted from the PWM processing section 20 through a buffer amplifier 23.

The PWM signal outputted from the second PWM signal generating circuit 24 is supplied to a D-type flip-flop circuit (D-FF) 25, in which it is converted into a pulse of a timing synchronized with a clock supplied to the PWM processing section 20. A PWM signal outputted from the D-type flip-flop circuit 25 (this PWM signal will hereinafter be referred to as a "second PWM signal") is outputted from the PWM processing section 20 through a buffer amplifier 26.

The first PWM signal outputted from the buffer amplifier 23 in the PWM processing section 20 is supplied through a buffer amplifier 31 within a switching module 30 to the gate of a first switching element 32. The second PWM signal outputted from the buffer amplifier 26 in the PWM processing section 20 is supplied through a buffer amplifier 33 within the switching module 30 to the gate of a second switching element 34.

The first and second switching elements 32 and 34 are each comprised of a MOS (metal-oxide semiconductor) type field-effect transistor the source-drain path of which conducts under control of a PWM signal developed at the gate thereof.

The first and second switching elements 32 and 34 are configured as means for switching a DC power supply output from the power-supply circuit 15. Specifically, there is prepared the power-supply circuit 15 which generates a stabilized DC voltage by rectifying and smoothing a commercially-available AC voltage, for example. An output end of the positive (+) power source obtained at this power-supply circuit 15 is connected to the source of the first switching element 32, and an output end of the negative (−) power source obtained at the power-supply circuit 15 is connected to the drain of the second switching element 34. Then, the drain of the first switching element 32 and the source of the second switching element 34 are commonly connected to provide a junction 40. A signal developed at this junction 40 is supplied to a low-pass filter (LPF) 14 as an output of the switching module 30.

The low-pass filter 14 extracts an audio signal component by eliminating a high frequency component contained in the signal when the switching elements 32 and 34 are driven. The audio signal extracted by the low-pass filter 14 is supplied to a speaker apparatus 2 connected to a speaker connection terminal (not shown) of this digital power amplifier 10 as an output audio signal of the audio power amplifier, and an audio signal is outputted from this speaker apparatus 2.

Since the PWM signals which are in 180° phase relationship with each other are respectively supplied to the gates of the two switching elements 32 and 34 as switching control signals, the two switching elements 32 and 34 are driven in a push-pull fashion with the result that an audio signal waveform the level of which moves up and down at 0 V is extracted from the low-pass filter 14.

FIGS. 5A through 5G are diagrams of waveforms showing examples of signals used within the digital power amplifier 10 shown in FIG. 4, respectively When the first PWM signal outputted from the first PWM signal generating circuit 21, for example, has a waveform shown in FIG. 5A, the second PWM signal outputted from the second PWM signal generating circuit 24 has a waveform shown in FIG. 5B, and the first and second PWM signals which are opposite in phase with each other are generated at the equal timing. Accordingly, the timing of the leading edge of the pulse waveform of the first PWM signal and the timing of the trailing edge of the pulse waveform of the second PWM signal become equal to each other, and the timing of the trailing edge of the pulse waveform of the first PWM signal and the timing of the leading edge of the pulse waveform of the second PWM signal become equal to each other.

Then, the first PWM signal is supplied through the D-type flip-flop circuit 22 and the buffer amplifiers 23 and 31 to the gate of the first switching element 32 as the switching control signal, whereby the switching control signal (see FIG. 5C) supplied to the gate of the first switching element 32 is supplied at a timing delayed by a time delay $t_1$ which is required by this switching control signal to pass these circuits. Furthermore, since the second PWM signal is supplied through the D-type flip-flop circuit 25 and the buffer amplifiers 26 and 33 to the gate of the second switching element 34 as the switching control signal, the switching control signal (see FIG. 5D) supplied to the gate of the second switching element 34 also is supplied at a timing delayed by the time delay $t_1$ which is required by this switching control signal to pass these circuits.

Accordingly, a differential component (first differential component) generated when the first switching element 32 is switched is generated on the positive (+) side at a timing equal to the leading edge of the switching control signal and is also generated on the negative (−) side at a timing equal to the trailing edge of the switching control signal as shown in FIG. 5E. A differential component (second differential component) generated when the second switching element 34 is switched is generated on the positive (+) side at a timing equal to the leading edge of the switching control signal and is also generated on the negative (−) side at a timing equal to the trailing edge of the switching control signal as shown in FIG. 5F.

In the case of this embodiment, since the first switching control signal and the second switching control signal are those signals which are inverted in phase at the equal timing, the first differential component shown in FIG, 5E and the second differential component shown in FIG, 5F cancel with each other out so that the radiation of the differential component from the switching module 30 can be suppressed as shown in FIG. 5G.

Since the radiation of the whole of the switching module 30 is suppressed, noise can be prevented from being generated from the power source when the first and second switching elements 32 and 34 are switched. As a consequence, characteristics of an audio signal outputted from the speaker apparatus 2 connected to the digital power amplifier 10 can be protected from being deteriorated due to the influences of noise generated from the power source. Therefore, there can be maintained satisfactory audio output characteristics.

While the two circuits of the first PWM signal generating circuit 21 and the second PWM signal generating circuit 24 are disposed within the PWM processing section 20 which generates the PWM signal and the first and second PWM signal generating circuits 21 and 24 generate the two PWM signals which are inverted in phase with each other, respectively, as described above, the present invention is not limited thereto and the following variant is also made possible. That is, if the PWM processing section 20 can generate the PWM signals whose phases are inverted at the equal timing, then only one PWM signal generating circuit may be provided within the PWM processing section 20 and two PWM signals whose phases are inverted at the equal timing may be generated based upon the output from one PWM signal generating circuit and may be supplied to the switching module 30. In this case, if necessary, there may be provided delay means for delaying a timing of one PWM signal of the two PWM signals so that the timing of the delayed PWM signal may agree with that of the other PWM signal.

When the digital power amplifier is configured as in the embodiment shown in FIG. 4 as described above, the first and second PWM signals which are equal to each other in timing can be generated from the two PWM signal generating circuits having substantially the same fundamental circuit arrangement. Therefore, the two PWM signals which are inverted from each other in phase at the equal timing can be supplied by the relatively simple circuit arrangement which does not require a timing correction delay means and the like.

While there is provided the DC power-supply including the output end of the positive (+) power source and the output end of the negative (−) power source as the power-supply as described above in the embodiment shown in FIG. 4, the present invention is not limited thereto and the DC power-supply may include voltages of any one of the polarities. In this case, the other end of one switching element is grounded and a DC blocking capacitor is inserted into an output path so that a DC component may be prevented from being supplied to the speaker apparatus 2.

Further, the present invention may be applied to the case in which two sets of the switching modules 30 are prepared to provide a BTL (bridged-tied load) configuration. Specifically, the speaker apparatus 2 which is the load may be connected between the junction of one switching module and the junction of the other switching module and the PWM signals which are inverted from each other in phase may be inputted into both of the switching modules.

Furthermore, while the pulse-width-modulated PWM signal is generated based upon the digital audio data of one bit system in which the inputted audio signal is converted and thereby the switching of the switching elements serving as the power switches is controlled as described above, the present invention is not limited thereto, and may also be applied to a so-called D-class power amplifier in which the switching of the switching element is controlled by other pulse modulated signal such as a PDM (pulse density modulation) signal.

According to the present invention, the timing at which one of the two switching means which are driven in a push-pull fashion conducts and the timing at which the other switching means does not conduct become equal to each other, the time differentials of consumed currents of the respective switching means are generated with opposite phases at the equal timing, and the differential components are canceled each other out as the total current of the two switching means. Accordingly, since the radiation of the PWM signal from the whole of the switching module portion can be suppressed and the outputted audio signal can be protected from being influenced by the noise from the power-supply, it is possible to improve the output audio characteristics.

In this case, since the circuit arrangement including the two pulse width modulating means is provided as the circuit arrangement capable of generating the first and second switching control signals by the switching control means, it becomes possible to generate the first and second switching control signals having the waveforms inverted from each other at the equal timing by the simple circuit arrangement.

Having described a preferred embodiment of the invention with reference to the accompanying drawings, it is to be understood that the invention is not limited thereto and that various changes and modifications could be effected therein by one skilled in the art without departing from the spirit or scope of the invention as defined in the appended claims.

What is claimed is:

1. A digital power amplifier, comprising:
   first switching control means for generating a first switching control signal;
   second switching control means for generating a second switching control signal, wherein said first and said second switching control signals are inverted in phase at an equal timing based upon an inputted audio signal;
   first switching means that one of conducts and does not conduct based on said first switching control signal; and
   second switching means that one of conducts and does not conduct based on said second switching control signal, wherein an output signal is obtained from a junction between said first and said second switching means.

2. The digital power amplifier according to claim 1, further comprising power supplying means for producing a stabilized DC voltage, wherein said DC voltage is supplied from said power supplying means to ends different from said junction between said first and said second switching means.

3. The digital power amplifier according to claim 2, wherein said power supplying means supplies a DC positive voltage and a DC negative voltage.

4. The digital power amplifier according to claim 1, further comprising extracting means for producing an output audio signal by extracting an audio signal component from said output signal developed at said junction between said first and said second switching means.

5. The digital power amplifier according to claim 1, wherein said first and said second switching control signals are pulse-width-modulated based upon said input audio signal.

6. A digital power amplifier, comprising:

first switching control means for generating a first switching control signal;

first switching means that one of conducts and does not conduct based on said first switching control signal;

second switching control means for generating a second switching control signal, wherein said first and said second switching control signals are inverted in phase at an equal timing based upon an input audio signal;

second switching means that one of conducts and does not conduct based on said second switching control signal;

third switching means that one of conducts and does not conduct based on said first switching control signal; and fourth switching means that one of conducts and does not conduct based on said second switching control signal, wherein output signals are generated from a first junction between said first and said second switching means and from a second junction between said third and said fourth switching means.

* * * * *